United States Patent
Hui et al.

(10) Patent No.: US 6,974,995 B1
(45) Date of Patent: Dec. 13, 2005

(54) METHOD AND SYSTEM FOR FORMING DUAL GATE STRUCTURES IN A NONVOLATILE MEMORY USING A PROTECTIVE LAYER

(75) Inventors: Angela Hui, Fremont, CA (US); Shenqing Fang, Sunnyvale, CA (US); Hiroyuki Kinoshita, Sunnyvale, CA (US); Kelwin Ko, San Jose, CA (US); Wenmei Li, Sunnyvale, CA (US); Yu Sun, Saratoga, CA (US); Hiroyuki Ogawa, Sunnyvale, CA (US); Chi Chang, Redwood City, CA (US)

(73) Assignees: Advanced Micro Devices, Inc., Sunnyvale, CA (US); Spansion LLC (JP)

(*) Notice: Subject to any disclaimer, the term of this patent is extended or adjusted under 35 U.S.C. 154(b) by 351 days.

(21) Appl. No.: 10/032,757

(22) Filed: Dec. 27, 2001

(51) Int. Cl.⁷ ............... H01L 27/105; H01L 29/772
(52) U.S. Cl. ............... 257/326; 257/384; 257/437
(58) Field of Search .................. 257/288, 314–326, 257/368–377, 382–385, 390, 391; 438/142, 197, 257–267, 275, 283, 584–588, 592, 652

(56) References Cited

U.S. PATENT DOCUMENTS

| | | | | |
|---|---|---|---|---|
| 5,933,730 A | * | 8/1999 | Sun et al. | 438/258 |
| 5,977,601 A | * | 11/1999 | Yang et al. | 257/437 |
| 5,981,339 A | * | 11/1999 | Chang et al. | 438/257 |
| 6,338,993 B1 | * | 1/2002 | Lien | 438/238 |

* cited by examiner

*Primary Examiner*—Howard Weiss
*Assistant Examiner*—Marcos D. Pizarro
(74) *Attorney, Agent, or Firm*—Winstead Sechrest & Minick P.C.

(57) ABSTRACT

A method and system for providing a semiconductor device is described. The semiconductor includes a core and a periphery. The method and system include providing a plurality of core gate stacks in the core, a plurality of sources in the core and a plurality of periphery gate stacks in the periphery. Each of the plurality of core gate stacks includes a first polysilicon gate and a WSi layer above the first polysilicon gate. The plurality of sources resides between a portion of the plurality of core gate stacks. Each of the plurality of periphery gate stacks includes a second polysilicon gate and a CoSi layer on the second polysilicon gate.

7 Claims, 7 Drawing Sheets

METHOD AND SYSTEM FOR FORMING DUAL GATE STRUCTURES IN A NONVOLATILE MEMORY USING A PROTECTIVE LAYER

FIELD OF THE INVENTION

The present invention relates to semiconductor devices, and more particularly to a method and system for providing dual gate structures having lower sheet resistance in a nonvolatile memory using a protective layer.

BACKGROUND OF THE INVENTION

Nonvolatile memory devices are used for a variety of applications. Such conventional semiconductor devices typically include a core and a periphery. The core typically has a number of memory devices, each of which includes a conventional core gate stack, a source at one end of the gate stack and a drain at the opposing end of the gate stack. Each conventional core gate stack includes a polysilicon gate, a WSi layer, a polysilicon capping layer and an SiN or SiON layer. The devices also include spacers at the ends of the conventional gate stacks. The periphery also includes a plurality of conventional devices. Each of the conventional devices at the periphery includes a conventional polysilicon gate and a WSi layer on the polysilicon gate. Between the conventional gates are source and drain regions at opposing edge of the gate. The source and drains are provided with WSi regions for connecting to the source and drain. In addition, conventional devices at the periphery include spacers at the ends of the gates.

In order for the conventional semiconductor device to function, electrical contact is made to the conventional gate stacks at the core and the conventional devices at the periphery. Typically, electrical contact is made to the conventional gate stacks at the core using the WSi layer. Similarly, electrical contact is made to the conventional gates at the periphery using the WSi layer. Electrical contact to the sources and drains is also provided through a WSi layer. As a result, electrical signals can be provided to the devices at the core and periphery of the conventional semiconductor device.

Although the conventional device functions, one of ordinary skill in the art will readily recognize that the conventional device has drawbacks. In particular, the WSi used to make electrical contact to the conventional gate at the periphery has a relatively high sheet resistance. As a result, the performance of the conventional semiconductor device suffers.

Accordingly, what is needed is a system and method for providing a semiconductor device having a lower sheet resistance, The present invention addresses such a need.

SUMMARY OF THE INVENTION

The present invention provides a method and system for providing a semiconductor device. The semiconductor includes a core and a periphery. The method and system comprise providing a plurality of core gate stacks in the core, a plurality of sources in the core and a plurality of periphery gate stacks in the periphery. Each of the plurality of core gate stacks includes a first polysilicon gate and a WSi layer above the first polysilicon gate. The plurality of sources resides between a portion of the plurality of core gate stacks. Each of the plurality of periphery gate stacks includes a second polysilicon gate and a CoSi layer on the second polysilicon gate.

According to the system and method disclosed herein, the present invention provides a nonvolatile memory device with contacts having a lower sheet resistance.

DETAILED DESCRIPTION OF THE INVENTION

The present invention relates to an improvement in semiconductor devices. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown, but is to be accorded the widest scope consistent with the principles and features described herein.

The present invention provides a method and system for providing a semiconductor device. The semiconductor includes a core and a periphery. The method and system comprise providing a plurality of core gate stacks in the core, a plurality of sources in the core and a plurality of periphery gate stacks in the periphery. Each of the plurality of core gate stacks includes a first polysilicon gate and a WSi layer above the first polysilicon gate. The plurality of sources resides between a portion of the plurality of core gate stacks. Each of the plurality of periphery gate stacks includes a second polysilicon gate and a CoSi layer on the second polysilicon gate.

The present invention will be described in terms of a method including particular steps. Furthermore, for clarity, some steps are omitted. One of ordinary skill in the art will, therefore, readily recognize that this method and system will operate effectively for other methods having different and/or additional steps. The present invention is also described in conjunction with a particular device having certain components. However, one of ordinary skill in the art will readily recognize that the present invention is consistent with a semiconductor device having other and/or different components.

Figure 1:
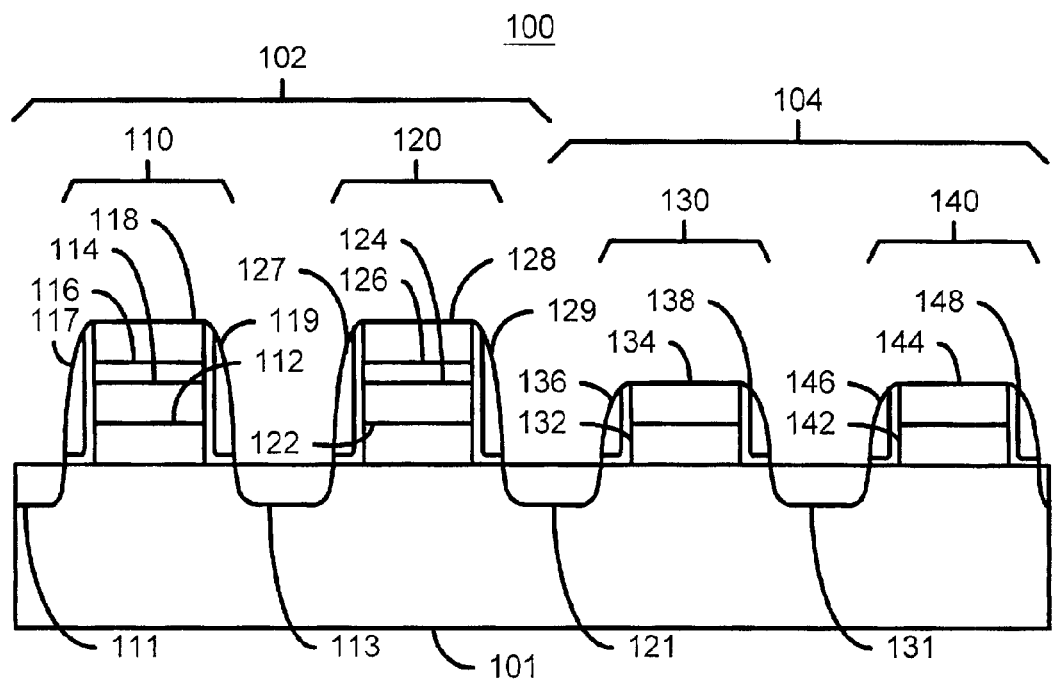
FIG. 1 is a diagram of one embodiment of a semiconductor device in accordance with the present invention having self-aligned contacts with lower sheet resistance.

To more particularly illustrate the method and system in accordance with the present invention, refer now to FIG. 1, depicting one embodiment of a semiconductor device 100 in accordance with the present invention. The semiconductor device 100 is preferably a nonvolatile memory device. The semiconductor device 100 includes a core 102 and a periphery 104. The core 102 includes devices such as memory cells, while the periphery 102 includes other devices, such as logic devices. Thus, the core 102 includes core gate stacks 110 and 120. The core gate stacks 110 and 120 each include a polysilicon gate 112 and 122, respectively, covered by a WSi layer 114 and 124, respectively. The WSi layers 114 and 124 are covered by a polysilicon capping layer 116 and 126, respectively, and an additional capping layer 118 and 128, respectively. The additional capping layers 118 and 128 are preferably formed from SiN or SiON. Thus, the additional capping layers 118 and 128 can preferably function as an antireflective layer (ARC) layer. Between the core gate stacks 110 and 120 are source and drain regions that includes CoSi regions 111, 113 and 121. At the edges of the core gate stacks 110 and 120 are spacers 117, 119, 127 and 129. The spacers 117, 119, 127 and 129 have two layers.

The periphery 104 of the semiconductor device 100 includes devices having periphery gate stacks 130 and 140. The periphery gate stacks 130 and 140 include first polysilicon gates 132 and 142, respectively, and CoSi layers 134 and 144, respectively. In addition, spacers 136 and 138 and spacers 146 and 148 are provided at opposing ends of the gate stacks 130 and 140, respectively.

Thus, the semiconductor device 100 utilizes CoSi to provide electrical contact to the gate stacks 130 and 140. As a result, electrical contacts to the devices in the periphery 104 will have a lower sheet resistance. Consequently, performance of the semiconductor is improved.

Figure 2:
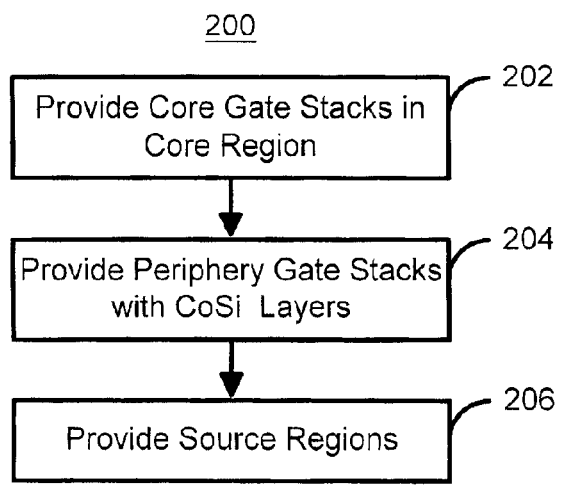
FIG. 2 is a high-level flow chart of one embodiment of a method in accordance with the present invention for providing a semiconductor device having self aligned contacts with a lower sheet resistance.

FIG. 2 is a high-level flow chart of one embodiment of a method 200 in accordance with the present invention for providing a semiconductor device having self aligned contacts with a lower sheet resistance. The semiconductor device has a core and a periphery, which are fabricated on a substrate. A plurality of core gate stacks in the core, via step 202. Each of the plurality of core gate stacks includes a first polysilicon gate and a WSi layer above the first polysilicon gate. Consequently, electrical contact can be made to the first polysilicon gate. In a preferred embodiment, spacers will also be formed at the edges of the core gate stacks.

A plurality of periphery gates stacks is provided in the periphery of the semiconductor device, via step 204. Step 204 includes providing a second polysilicon gate on the substrate and a CoSi layer on the second polysilicon gate for each of the plurality of periphery gate stacks. Thus, electrical contact can be made to the peripheral gate stacks.

A plurality of sources is provided in the core, via step 206. The plurality of sources is between a portion of the plurality of core peripheral gate stacks. Also in step 206, electrical connection is allowed to be made to the sources, preferably by providing a CoSi region in the sources. In a preferred embodiment, the connection to the sources is a self-aligned connection formed between the spacers.

Figure 3:
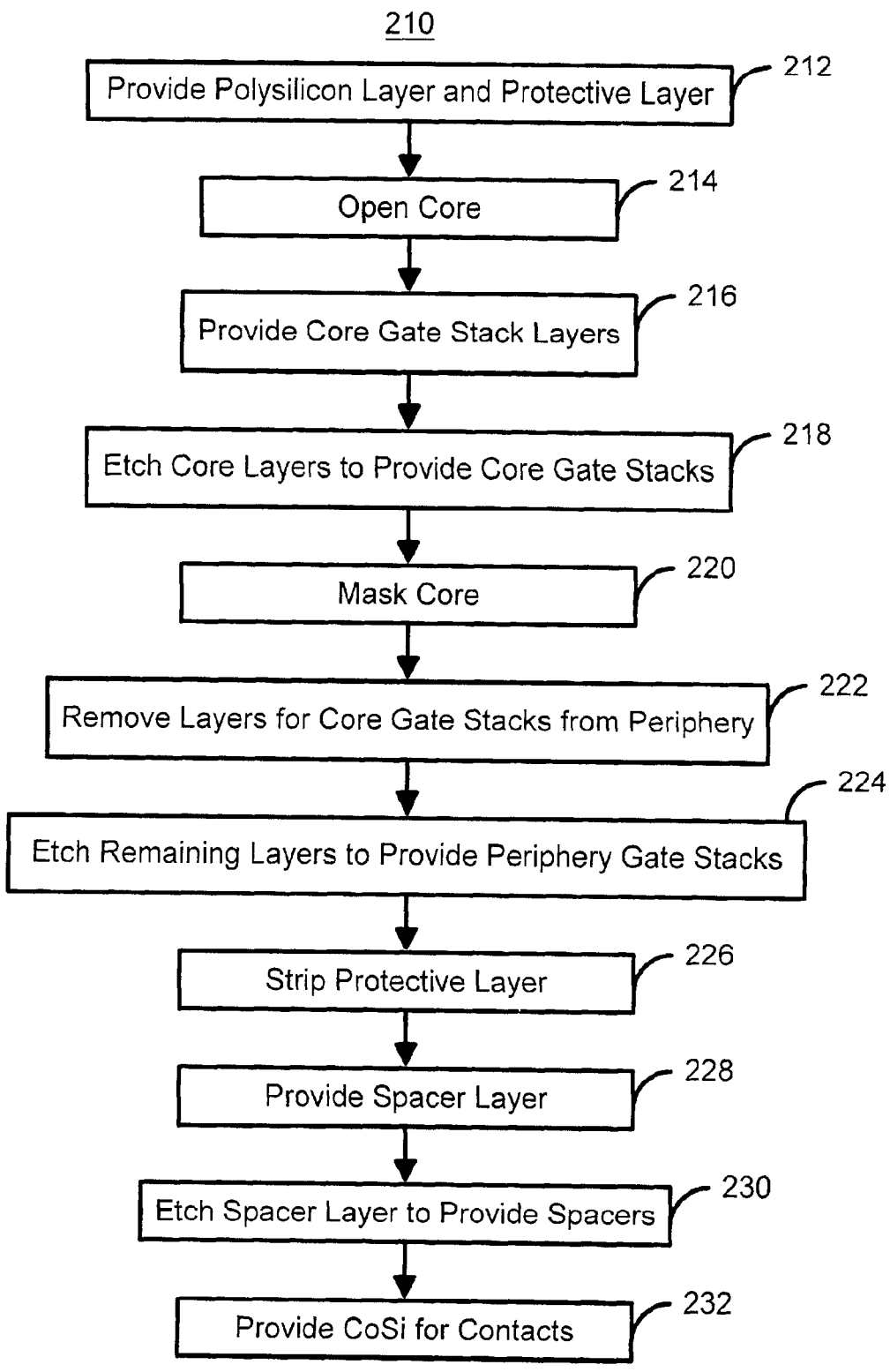
FIG. 3 is a more detailed flow chart of one embodiment of a method in accordance with the present invention for providing a semiconductor device having self aligned contacts with a lower sheet resistance.

FIG. 3 is a more detailed flow chart of one embodiment of a method 210 in accordance with the present invention for providing a semiconductor device having self aligned contacts with a lower sheet resistance. FIGS. 4A–4J depict one embodiment of the semiconductor device 200 in accordance with the present invention having self-aligned contacts with lower sheet resistance during fabrication. Thus, the method 210 depicted in FIG. 3 is described in conjunction with FIG. 4A–4J.

Figure 4A:
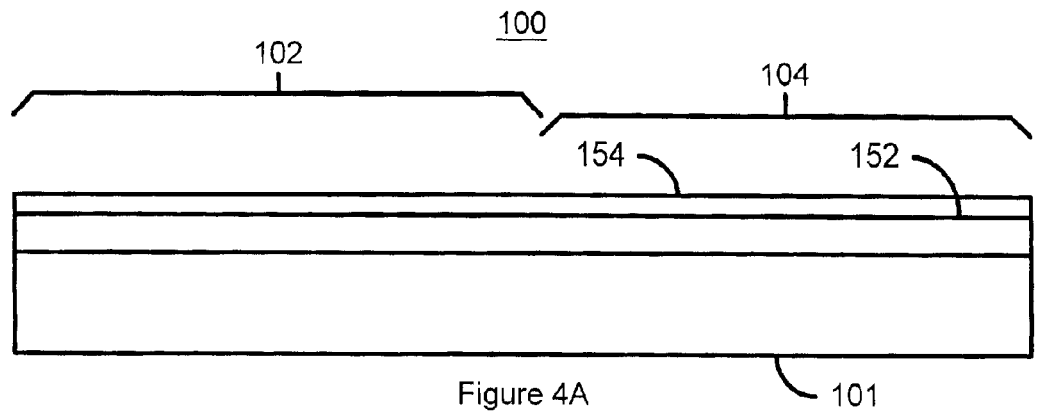
FIGS. 4A–4J depict one embodiment of a semiconductor device in accordance with the present invention having self-aligned contacts with lower sheet resistance during fabrication.
Figure 4B:
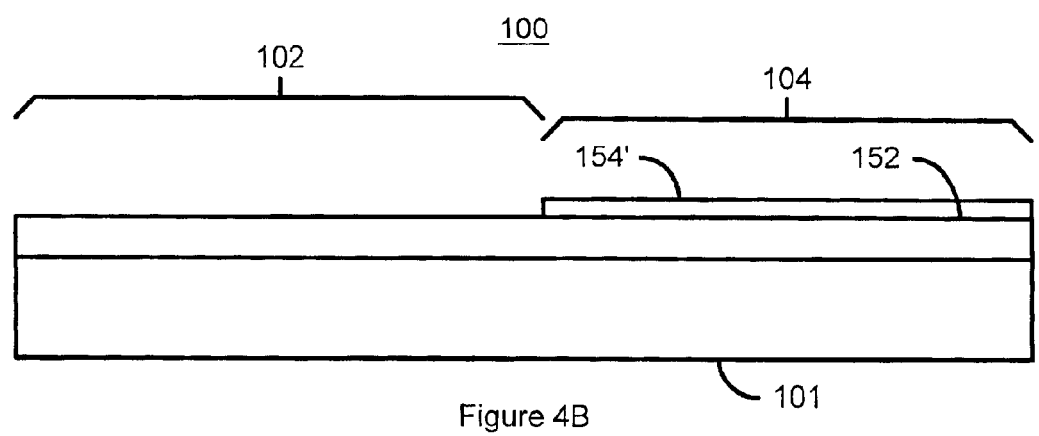

A first layer of polysilicon that will be used in forming gates and a protective layer are provided over a substrate 101 in both a core region 102 and a periphery 104, via step 212. FIG. 4A depicts the semiconductor device 100 after formation of the polysilicon layer 152 and the protective layer 154. The protective layer 154 is preferably made of SiN, SiON or an oxide. The portion of the protective layer that is over the core is then removed to open the core, via step 214. Preferably, step 214 includes providing a photoresist mask that has an aperture over the core 102 and covers the periphery 104. FIG. 4B depicts the semiconductor device 100 after step 214 is completed. The polysilicon layer 152 is exposed over the core 102, with a remaining portion 154' of the protective layer residing over the periphery 104.

Figure 4C:
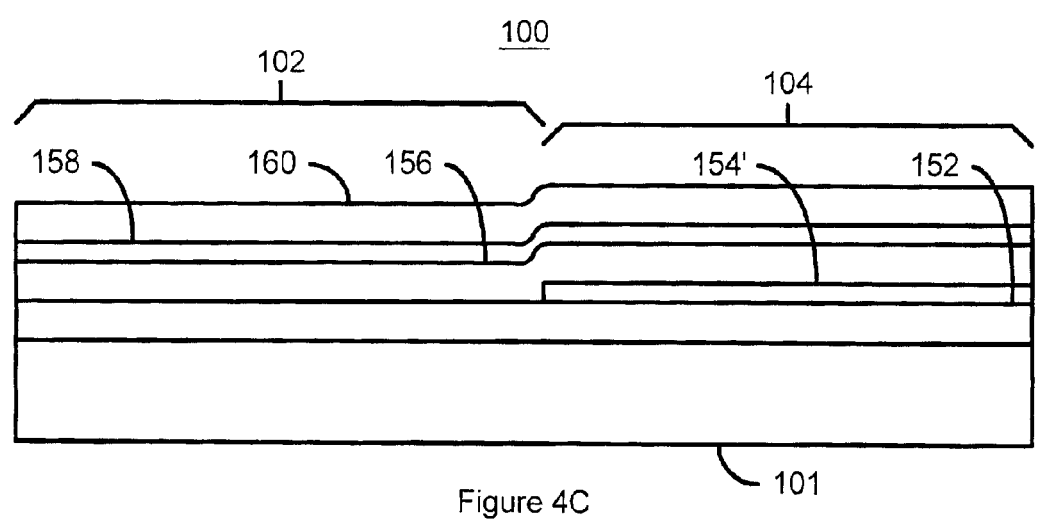

The layers for the core gate stacks are then provided, via step 216. FIG. 4C depicts the semiconductor device 100 after step 216 is completed. In a preferred embodiment, step 216 includes providing a WSi layer 156 directly on the portion of the polysilicon layer 152 that is exposed over the core 102, providing a polysilicon capping layer 158 directly on the WSi layer, and providing an additional layer 160 directly on the polysilicon capping layer 158. The additional layer 160 is preferably SiN, SiON or a combination of SiN and SiON. These layers 156, 158 and 160 preferably extend over both the core 102 and the periphery 104.

Figure 4D:
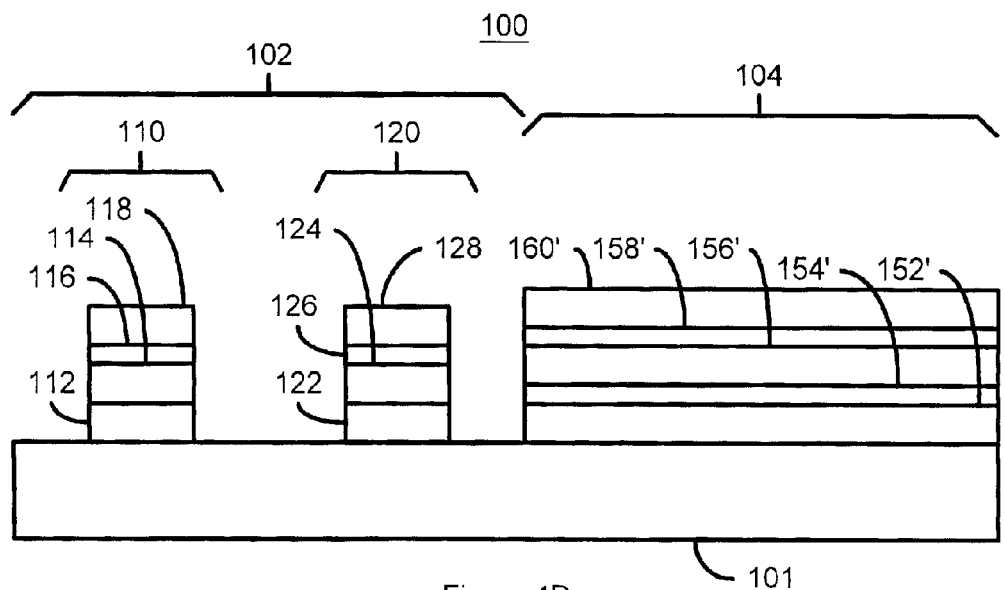

The core gate stacks are then formed, via step 218. Step 102 preferably includes providing a photoresist mask having apertures over portions of the core 102 which are between the gate stacks and etching the exposed portions of the semiconductor device 100. FIG. 4D detects the semiconductor device 100 after step 218 as completed. The gate stacks 110 and 120 have been formed in the core 102. The portions of layers 152', 154', 156', 158' and 160' remain in the periphery 104.

Figure 4E:
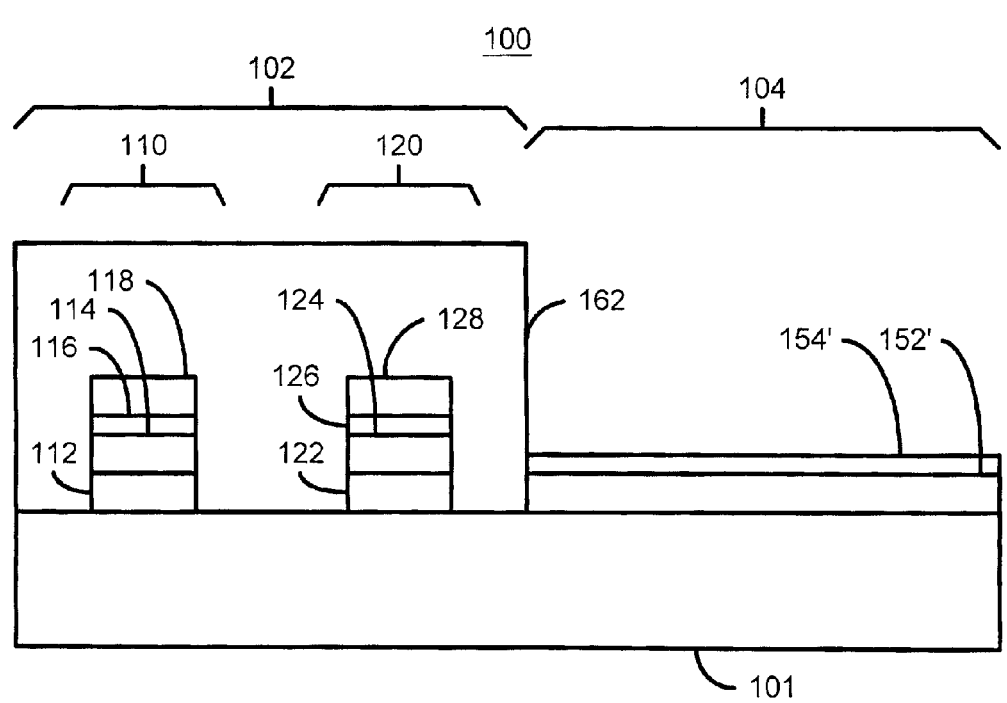

The core is then covered, via step 220. The remaining portions of the WSi layer 156', the polysilicon capping layer 158' and additional layer 160' that are in the periphery 102 ate then removed, via step 222. FIG. 4E depicts the semiconductor device 100 after step 220 has been completed. A photoresist layer 162 which covers the core 102, but exposes the periphery 104 has been provided. In addition, the layers above the portion of the protective layer 154' in the periphery 102 have been removed.

Figure 4F:
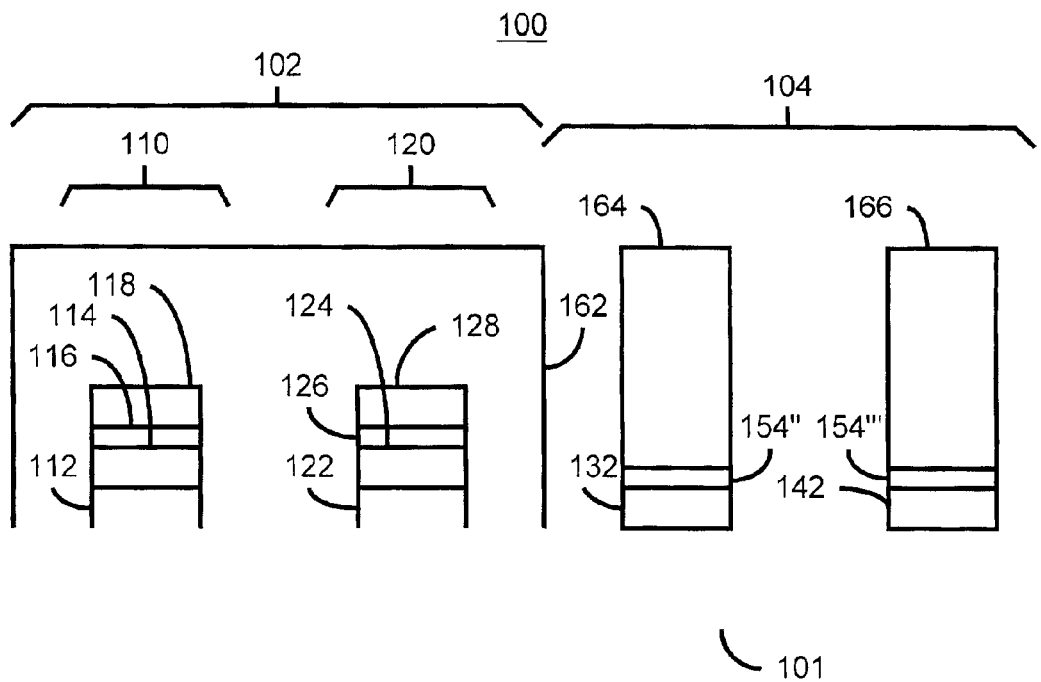

The periphery gate stacks are then formed, via step 224. Step 224 preferably includes providing a photoresist mask with apertures over the portions of the periphery 102 which will be between the periphery gate stacks. FIG. 4F depicts the semiconductor device 100 after step 224 has been performed. A photoresist layer 164 and 166 covers the portions of the first polysilicon layer 152'' and 152''' and protective layer 154'' and 154''' that are part of the periphery gate stacks.

Figure 4G:
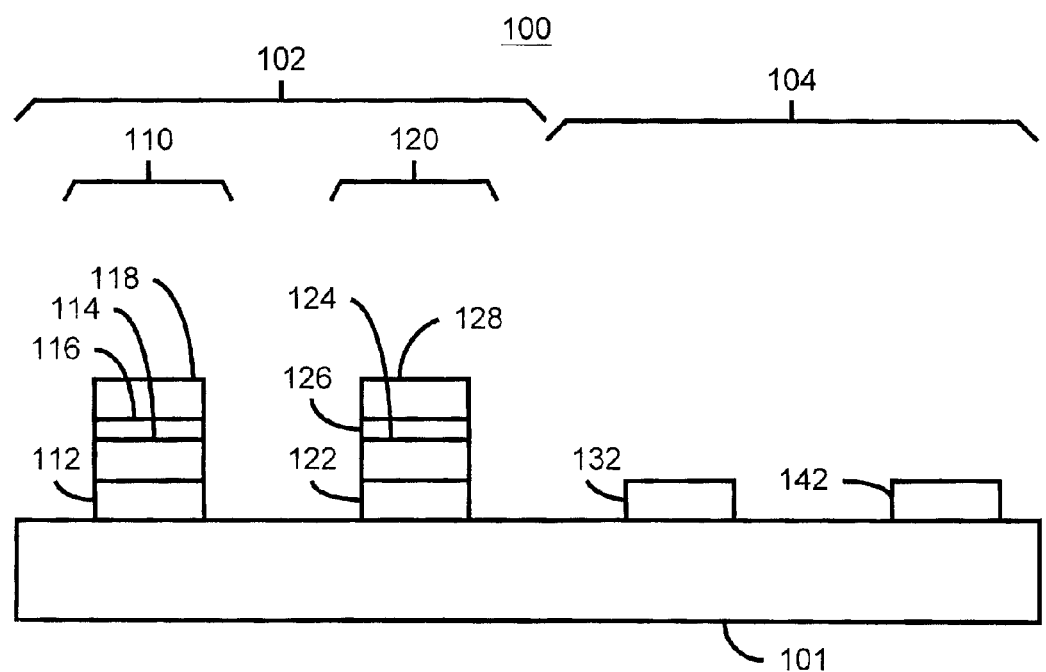

The protective layer 154' and 154''' is then stripped, via step 226. FIG. 4G depicts the semiconductor device 100 after step 226 has been performed. The protective layer 154'' and 154''' have been removed. In addition, the photoresist 164 and 166 have also been removed.

Figure 4H:
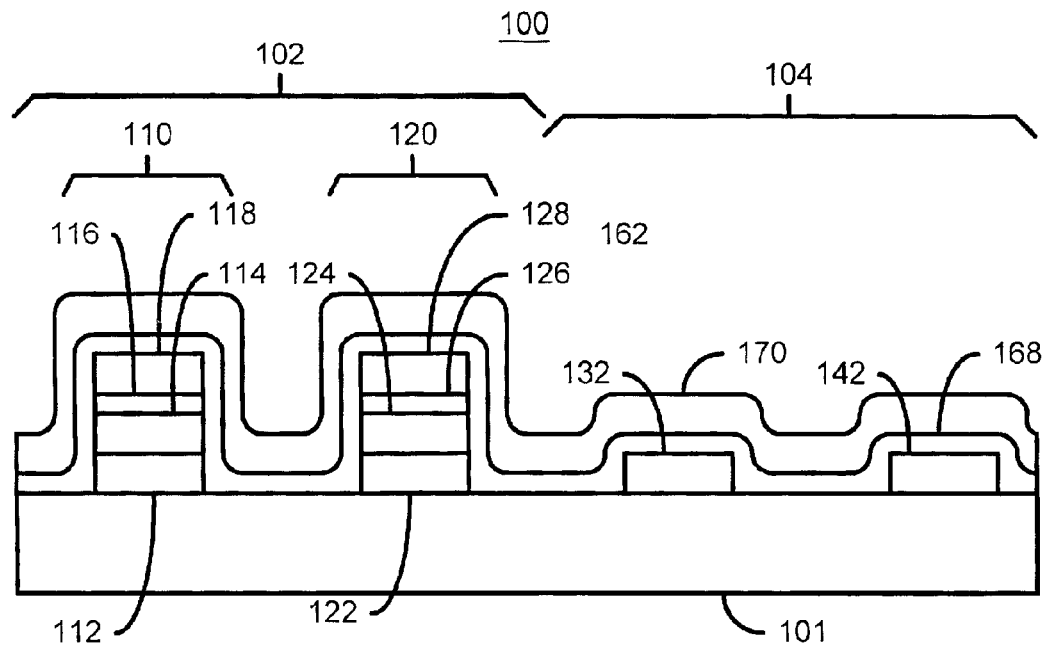

An oxide layer and a spacer layer are then provided over the core and the periphery, via step 228. FIG. 4H depicts the semiconductor device 100 after step 228 is performed. The photoresist 162 that covered the core 102 has been removed. An oxide layer 168 has been formed on the gate stacks in the core 102 and the periphery 104. In addition, a spacer layer 170 for spacers that will be made with the combination of film stacks 168 and 170 has been provided. The spacer layer 170 is an insulator.

Figure 4I:
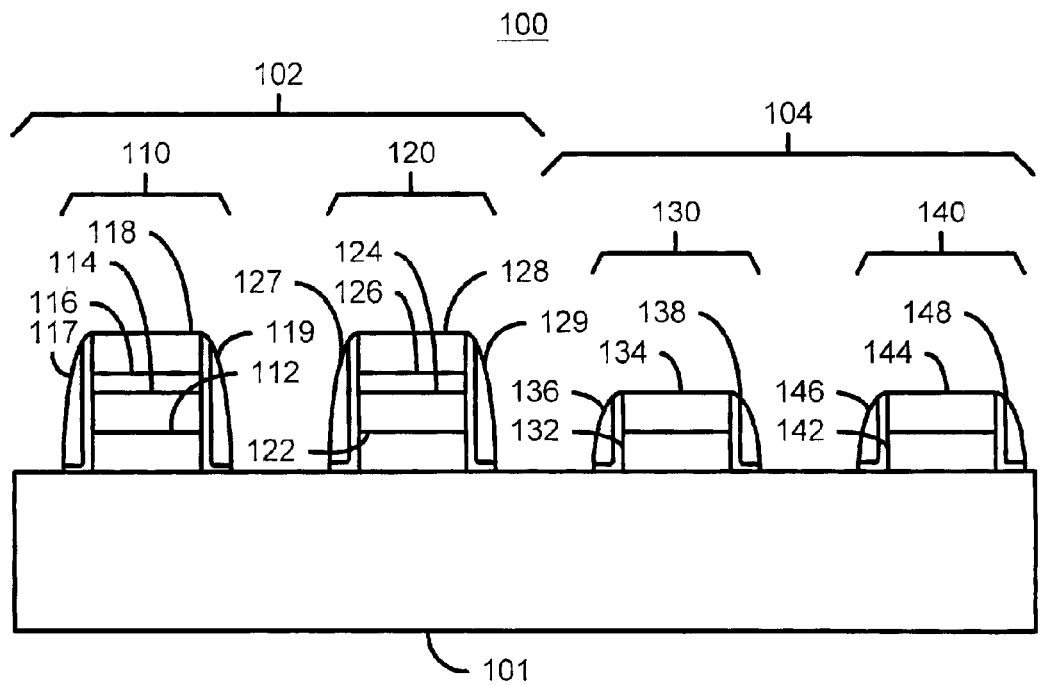
Figure 4J:
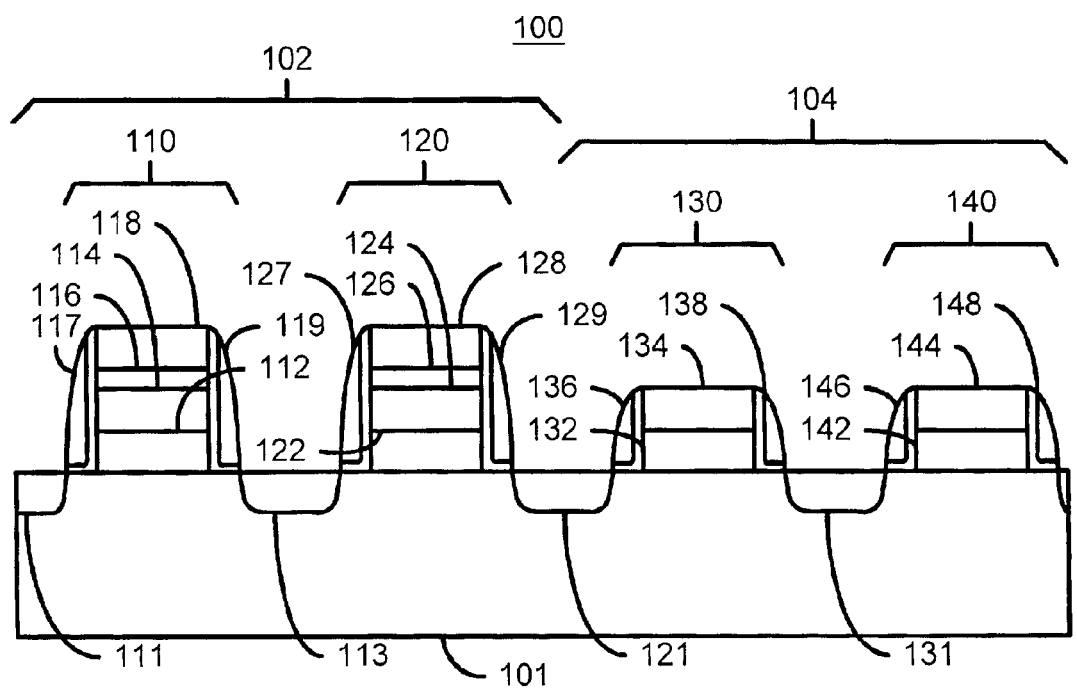

The spacers are then formed by etching the spacer layer 170, via step 230. FIG. 4I depicts the semiconductor device 100 after step 170 has been performed. The spacers 117, 119, 127,129, 136, 138, 146 and 148 have been formed. CoSi regions are then formed, via step 232. Preferably, step 232 forms self-aligned contacts in both the source regions in the core 102 as well as in the on the gate stacks 130 and 140 in the periphery. FIG. 4J depicts the semiconductor device 100 after step 232 has been performed. The semiconductor device 100 depicted in FIG. 4J is the same as depicted in FIG. 1.

Thus, the semiconductor device 100 utilizes CoSi to provide electrical contact to the gate stacks 130 and 140. As a result, electrical contacts to the devices in the periphery 104 will have a lower sheet resistance. Consequently, performance of the semiconductor is improved. Furthermore, the use of the protective layer 154 allows the first polysilicon layer to be used in the gate stacks in the core 102 as well as in the periphery 104.

A method and system has been disclosed for providing a nonvolatile memory device. Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A semiconductor device including a core and a periphery, the semiconductor device comprising:
    a plurality of core gate stacks in the core, each of the plurality of core gate stacks including a first polysilicon gate and a WSi layer above the first polysilicon gate, wherein each of the plurality of core gate stacks includes an edge;
    a plurality of core spacers, each of the plurality of core spacers residing along an edge of the plurality core gate stacks;
    a plurality of sources in the core, the plurality of sources residing between a portion of the plurality of core gate stacks; and
    a plurality of periphery gates stacks in the periphery, each of the plurality of periphery gate stacks including a second polysilicon gate and a CoSi layer on the second polysilicon gate;
    wherein each of the plurality of core gate stacks includes the first polysilicon gate, the WSi layer above the first polysilicon gate, a layer of polysilicon above the WSi later and a capping layer above the layer of polysilicon.

2. The semiconductor device of claim 1 wherein the capping layer is a SiN layer.

3. The semiconductor device of claim 1 wherein the capping layer is a SiON layer.

4. A semiconductor device comprising:
    a plurality of core gate stacks in a core, wherein each of said plurality of core gate stacks comprises a first polysilicon gate and a WSi layer above said first polysilicon gate and a polysilicon capping layer above said WSi layer and an additional capping layer above said polysilicon capping layer;
    a plurality of sources in said core, wherein said plurality of sources resides between a portion of said plurality of core gate stacks; and
    a plurality of periphery gate stacks in a periphery, wherein each of said plurality of periphery gate stacks comprises a second polysilicon gate and a CoSi layer above said second polysilicon gate.

5. The semiconductor device as recited in claim 4 wherein said additional capping layer functions as an antireflective layer.

6. The semiconductor device as recited in claim 4 wherein said additional capping layer is a SiN layer.

7. The semiconductor device as recited in claim 4, wherein said additional capping layer is a SiON layer.

* * * * *

UNITED STATES PATENT AND TRADEMARK OFFICE
CERTIFICATE OF CORRECTION

PATENT NO. : 6,974,995 B1  
DATED : December 13, 2005  
INVENTOR(S) : Angela Hui et al.

It is certified that error appears in the above-identified patent and that said Letters Patent is hereby corrected as shown below:

Title page,
Item [73], Assignee, delete "Advanced Micro Devices, Inc., Sunnyvale, CA (US);".

Signed and Sealed this

Twenty-eighth Day of March, 2006

JON W. DUDAS
*Director of the United States Patent and Trademark Office*